(12) United States Patent
Lee

(10) Patent No.: US 12,366,970 B2
(45) Date of Patent: Jul. 22, 2025

(54) STORAGE DEVICE AND OPERATING METHOD

(71) Applicant: SAMSUNG ELECTRONICS CO., LTD., Suwon-si (KR)

(72) Inventor: Seunghan Lee, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 246 days.

(21) Appl. No.: 17/983,455

(22) Filed: Nov. 9, 2022

(65) Prior Publication Data
US 2023/0147773 A1    May 11, 2023

(30) Foreign Application Priority Data
Nov. 10, 2021  (KR) .................. 10-2021-0154290

(51) Int. Cl.
  *G06F 3/06* (2006.01)
(52) U.S. Cl.
  CPC .......... *G06F 3/0619* (2013.01); *G06F 3/0659* (2013.01); *G06F 3/0679* (2013.01)
(58) Field of Classification Search
  CPC ..... G06F 3/0619; G06F 3/0659; G06F 3/0679
  See application file for complete search history.

(56) References Cited

U.S. PATENT DOCUMENTS

| | | | | |
|---|---|---|---|---|
| 7,676,626 B2* | 3/2010 | Lee | ................ | G06F 3/0643 365/63 |
| 8,775,368 B1* | 7/2014 | Burke | ................ | G06F 16/23 707/609 |
| 10,037,160 B2 | 7/2018 | Kong et al. | | |
| 10,372,342 B2 | 8/2019 | Dusija et al. | | |
| 2008/0065815 A1* | 3/2008 | Nasu | ................ | G06F 3/0688 711/103 |
| 2014/0071753 A1 | 3/2014 | Shin | | |

(Continued)

FOREIGN PATENT DOCUMENTS

| | | |
|---|---|---|
| EP | 2940691 B1 | 8/2020 |
| JP | 2009-048680 A | 3/2009 |

(Continued)

OTHER PUBLICATIONS

European Search Report Dated Mar. 28, 2023, Cited in EP Patent Application No. 22206251.5.

(Continued)

*Primary Examiner* — Eric Cardwell
(74) *Attorney, Agent, or Firm* — Fish & Richardson P.C.

(57) ABSTRACT

A storage device may include; a non-volatile memory including a first memory region including first memory cells having a first data storage capacity, a second memory region including second memory cells having a second data storage capacity greater than the first data storage capacity, and a third memory region including third memory cells having a third data storage capacity greater than the second data storage capacity, and a storage controller configured to receive a request, data, and storage time information associated with the data from a host, and program the data in a selected one of the first memory region, the second memory region and the third memory region in response to the request and on the basis of the storage time information.

19 Claims, 11 Drawing Sheets

(56) References Cited

U.S. PATENT DOCUMENTS

| | | | | |
|---|---|---|---|---|
| 2015/0293713 A1* | 10/2015 | Seo | .................... | G11C 16/349 |
| | | | | 711/103 |
| 2017/0285967 A1* | 10/2017 | Pandurangan | ........ | G06F 3/0605 |
| 2018/0081594 A1 | 3/2018 | Jung et al. | | |
| 2020/0192595 A1* | 6/2020 | Fisher | ................... | G06F 3/0619 |
| 2021/0011623 A1* | 1/2021 | Fay | .................... | G06F 16/9035 |

FOREIGN PATENT DOCUMENTS

| | | |
|---|---|---|
| JP | 2010-198407 A | 9/2010 |
| JP | 2012-009112 A | 1/2012 |
| KR | 10-0833188 | 5/2008 |
| KR | 10-2017-0113013 | 10/2017 |
| KR | 10-2243920 | 4/2021 |

OTHER PUBLICATIONS

Notice of Allowance in European Appln. No. 22206251.5, mailed on Nov. 6, 2024, 8 pages.

\* cited by examiner

| MEMORY REGION | DATA RETENTION REFERENCE TIME |
|---|---|
| FIRST MEMORY REGION (SLC) | TR1 |
| SECOND MEMORY REGION (MLC, TLC) | TR2 |
| THIRD MEMORY REGION (QLC) | - |

US 12,366,970 B2

STORAGE DEVICE AND OPERATING METHOD

CROSS-REFERENCE TO RELATED APPLICATION

This application claims priority under 35 U.S.C. § 119 to Korean Patent Application No. 10-2021-0154290 filed on Nov. 10, 2021 in the Korean Intellectual Property Office, the subject matter of which is hereby incorporated by reference in its entirety.

BACKGROUND

The inventive concept relates to storage devices and operating method for same. More particularly, the inventive concept relates to storage devices including memory cells having different data capacities and operating methods for same.

Flash memory is one type of non-volatile memory able to retain stored data in the absence of applied power. Storage devices including flash memory, such as solid state drives (SSDs) and memory cards, are widely available. Flash memory stores data by varying the threshold voltage of constituent memory cells, and reads data using various predetermined read level(s). However, the threshold voltage of certain memory cells may undesirably migrate (or shift) over time due various factors such as performance degradation of the memory cells. And shifted threshold voltages may result in read errors.

SUMMARY

Embodiments of the inventive concept provide storage devices and related operating methods, wherein write data may be written in a predetermined data region according to one or more characteristics of the data. Accordingly, data reliability associated with embodiments of the inventive concept may be enhanced and overall performance may be improved.

According to an aspect of the inventive concept, a storage device may include; a non-volatile memory including a first memory region including first memory cells having a first data storage capacity, a second memory region including second memory cells having a second data storage capacity greater than the first data storage capacity, and a third memory region including third memory cells having a third data storage capacity greater than the second data storage capacity, and a storage controller configured to receive a request, data, and storage time information associated with the data from a host, and program the data in a selected one of the first memory region, the second memory region and the third memory region in response to the request and on the basis of the storage time information. wherein the storage controller is further configured to program the data in the first memory region when a storage time for the data is greater than or equal to a first reference time, program the data in the second memory region when the storage time for the data is greater than or equal to a second reference time and less than the first reference time, and program the data in the third memory region when the storage time for the data is less than the second reference time.

According to an aspect of the inventive concept, a storage device may include; a non-volatile memory including a first memory region including first memory cells having a first data storage capacity, a second memory region including second memory cells having a second data storage capacity greater than the first data storage capacity, and a third memory region including third memory cells having a third data storage capacity greater than the second data storage capacity, and a storage controller including a processor and a memory configured to store a machine learning model, wherein the storage controller is configured to program data in the non-volatile memory in response to a write request received from a host, extract storage time information for the data from characteristic information of the data through machine learning inference using the machine learning model, and program the data in a selected one of the first memory region, the second memory region, and the third memory region on the basis of the storage time information.

According to an aspect of the inventive concept, a storage device may include; a non-volatile memory including a first memory region including first memory cells having a first data storage capacity, a second memory region including second memory cells having a second data storage capacity greater than the first data storage capacity, and a third memory region including third memory cells having a third data storage capacity greater than the second data storage capacity, and a storage controller configured to receive a request, data, and storage time information associated with the data from a host, and program the data in a selected one of the first memory region, the second memory region and the third memory region in response to the request and on the basis of the storage time information, wherein the first memory cells are single level memory cells configured to store 1-bit data, the second memory cells are multi-level memory cells configured to store at least one of 2-bit data and 3-bit data, and the third memory cells are quad-level memory cells configured to store 4-bit data, the storage controller is further configured to program the data in the first memory region when a storage time for the data is greater than or equal to a first reference time, program the data in the second memory region when the storage time for the data is greater than or equal to a second reference time and less than the first reference time, program the data in the third memory region when the storage time for the data is less than the second reference time, and self-erase the data following elapse of an erase expectation time after the data is programmed, wherein the erase expectation time is determined on the basis of the storage time information.

According to an aspect of the inventive concept, an operating method for a storage device may include; receiving a write request, data, and storage time information associated with the data, programming the data in an allocated memory region of a non-volatile memory included in the storage device on the basis of the storage time information, wherein the non-volatile memory includes a first memory region including first memory cells having a first data storage capacity, a second memory region including second memory cells having a second data storage capacity greater than the first data storage capacity, and a third memory region including third memory cells having a third data storage capacity greater than the second data storage capacity, and self-erasing the data when an erase expectation time elapses after the data is programmed, wherein the erase expectation time is determined on the basis of the storage time information.

According to an aspect of the inventive concept, an operating method for a storage device may include; collecting characteristic information and storage time information for data stored in a non-volatile memory included in the storage device, performing machine learning training using collected characteristic information and storage time information to extract a machine learning model, receiving a new write request and new write data, extracting storage time information for the new write data from the characteristic information through machine learning inference using the machine learning model, and programming the new write data in an allocated memory region of the non-volatile memory on the basis of the extracted storage time information.

BRIEF DESCRIPTION OF THE DRAWINGS

Advantages, benefits, features, as well as the making and use of the inventive concept, may be more clearly understood upon consideration of the following detailed description together with the accompanying drawings, in which.

DETAILED DESCRIPTION

Throughout the written description and drawings, like reference numbers and labels are used to denote like or similar elements.

Figure (FIG.) 1 is a block diagram illustrating a storage system 10 according to an embodiment.

The storage system 10 may be implemented, for example, as a personal computer (PC), a data server, a network-attached storage (NAS), an Internet of things (IoT) device, or a portable electronic device. The portable electronic device may include a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a hand-held game console, an e-book, and a wearable device.

In some embodiments, each of the host 200 and the storage device 100 may generate and communicate (e.g., send and/or receive) packet(s) in accordance with one or more conventionally-understood and commercially-available data communication protocols.

The storage device 100 may include storage media configured to receive, store and thereafter provide data in response to one or more request(s) received from a host 200. For example, the storage device 100 may include at least one solid state drive (SSD), embedded memory, and/or attachable/detachable external memory. Where the storage device 100 includes an SSD, the storage system 10 may operate in accordance with one or more conventionally-understood and commercially-available technical standards, such as those associated with the non-volatile memory express (NVMe) standard. Where the storage device 100 includes an embedded memory and/or an external memory, the storage system 10 may operate in accordance with one or more conventionally-understood and commercially-available technical standards, such as those associated with the universal flash storage (UFS) standard or the embedded multi-media card (eMMC) standard. In some embodiments, the storage device 100 may be an embedded memory that is embedded within the storage system 10. For example, the storage device 100 may include an eMMC memory device and/or an embedded UFS memory device. Alternately or additionally, the storage device 100 may include an external memory that is selectively attachable to and/or detachable from the storage system 10, such as a UFS memory card, compact flash (CF), secure digital (SD), micro secure digital (Micro-SD), mini secure digital (Mini-SD), extreme digital (xD), and/or a memory stick.

Figure 1:
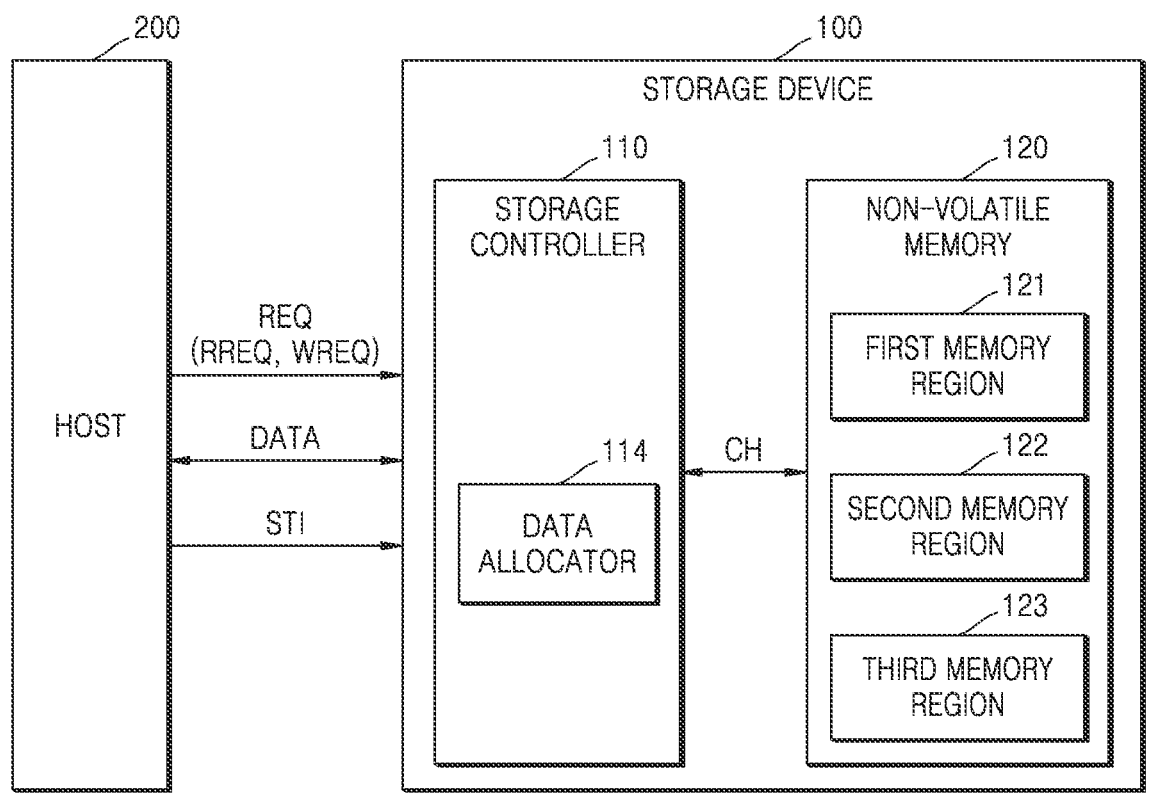
FIG. 1 is a block diagram illustrating a storage system according to embodiment.

Referring to FIG. 1, the storage system 10 may generally include the host 200 and the storage device 100, wherein the storage device 100 may include a storage controller 110 and a non-volatile memory 120.

The host 200 may communicate with the storage device 100 through one or more interface(s) in order to transfer a request REQ (e.g., a read request or a write (or program) request) to the storage device 100. In some embodiments, the host 200 may be implemented as an application processor (AP) or a system-on-a-chip (SoC).

The storage controller 110 may control operation of the non-volatile memory 120 through one or more channel(s) CH. The storage controller 110 may "read data" DATA stored in the non-volatile memory 120 in response to a read request RREQ received from the host 200, or may control the non-volatile memory 120 to program "write data" DATA in the non-volatile memory 120 in response to a write request WREQ from the host 200.

In this regard during a program operation, the host 200 may provide the storage device 100 with storage time information STI associated with the data DATA, in addition to the write request WREQ and the write data DATA. The host 200 may set a storage time based on a characteristic of the write data DATA and may provide the corresponding storage time information STI along with the write data DATA to the storage device 100. The storage time information STI may include information about a storage time set which is based on a characteristic of the data DATA and may include, for example, information indicating a minimum storage time needed to maintain a programmed state while satisfying a reliability condition for the data DATA after the data DATA is programmed. That is, the data DATA may need to maintain reliability and a programmed state for a particular storage time after being programmed in the non-volatile memory 120.

In some embodiments such as the storage system 10 of FIG. 1, the storage controller 110 of the storage device 100 may include a data allocator 114. When a write request WREQ, corresponding write data DATA and the storage time information STI associated with the data DATA are received from the host 200, the data allocator 114 may determine a particular memory region (e.g., select among a first memory region MR1, a second memory region MR2, and a third memory region MR3 (hereafter, "first to third memory regions MR1 to MR3")) of the non-volatile memory 120 in response to (or on the basis of) the storage time information STI. In this manner, the storage controller 110 may control the non-volatile memory 120 so that write data DATA is programmed to a particular memory region.

When the non-volatile memory 120 of the storage device 100 includes flash memory, the flash memory may include a two-dimensional (2D) NAND memory array or a three-dimensional (3D) (or vertical) NAND (VNAND) memory array. Alternately or additionally, the non-volatile memory 120 may include other type(s) of non-volatile memory, such as for example, magnetic random access memory (RAM) (MRAM), spin-transfer torque MRAM, conductive bridging RAM (CBRAM), ferroelectric RAM (FeRAM), phase-change RAM (PRAM), and resistive RAM (ReRAM).

Further in this regard, the non-volatile memory 120 may be understood as including a number of designated memory regions, wherein at least some of the memory cells in each of the memory regions are characterized by different data storage capacities. For example, extending the example wherein the non-volatile memory 120 is assumed to include the first to third memory regions MR1 to MR3, the first memory region MR1 may include first (or first type) memory cells reliably capable of storing (i)-bit data (e.g., first memory cells having (or configured to have) a first data storage capacity), the second (or second type) memory region MR2 may include second memory cells reliably capable of storing (j)-bit data (e.g., second memory cells having (or configured to have) a second data storage capacity different from the first data storage capacity), and the third memory region MR3 may include third (or third type) memory cells reliably capable of storing (k)-bit data (e.g., third memory cells having (or configured to have) a third data storage capacity different from the first data storage capacity and the second data storage capacity), wherein 'i', 'j', and 'k' are natural numbers, 'j' is greater than 'i', and 'k' is greater than 'j'.

In some embodiments, the first memory region MR1 may include single level memory cells (SLC) storing single bit (1-bit) data, the second memory region MR2 may include multi-level memory cells (MLC) (e.g., triple-level cells (TLC)) storing two or three bits data, and the third memory region MR3 may include quad-level memory cells (QLC) storing four bits of data.

Alternately, assuming the designation of four memory regions within the nonvolatile memory 120, the non-volatile memory 120 may, for example, include a first memory region including 1-bit SLC, a second memory region including 2-bit MLC, a third memory region including 3-bit TLC, and a fourth memory region including 4-bit QLC.

With the foregoing exemplary configurations in mind, those skilled in the art will appreciate that as data capacity for a memory cell increases, the reliable retention time of data stored by the memory cell decreases. Thus, extending the working example, a first memory cell retention time associated with the first memory region MR1 may be longer than a second memory cell retention time associated with the second memory region MR2, and the second memory cell retention time may be longer than a third memory cell retention time associated with the third memory region MR3.

In some embodiments, the storage controller 110 of the storage device 100 may be used to determine (or select) a memory region from among a plurality of memory regions in which write data DATA is to be stored on the basis of the storage time information STI associated with the write data DATA. For example, assuming a case wherein the write data DATA is to be stored in the storage device 100 for a relatively long period of time, the storage device 100 may program the write data DATA in a first memory region 121. Assuming another case wherein the write data DATA is to be stored in the storage device 100 for an intermediate period of time, the storage device 100 may program the data DATA in a second memory region 122, and assuming yet another case wherein the write data DATA is to be stored in the storage device 100 for a relatively short period of time, the storage device 100 may program the data DATA in a third memory region 123.

Using this approach as enabled by embodiments of the inventive concept, a storage device operating in a storage system may decrease cycle count(s) for program operations and/or erase operations associated with a recovery code while enhancing data reliability, thereby improving overall performance for the storage system.

Figure 2:
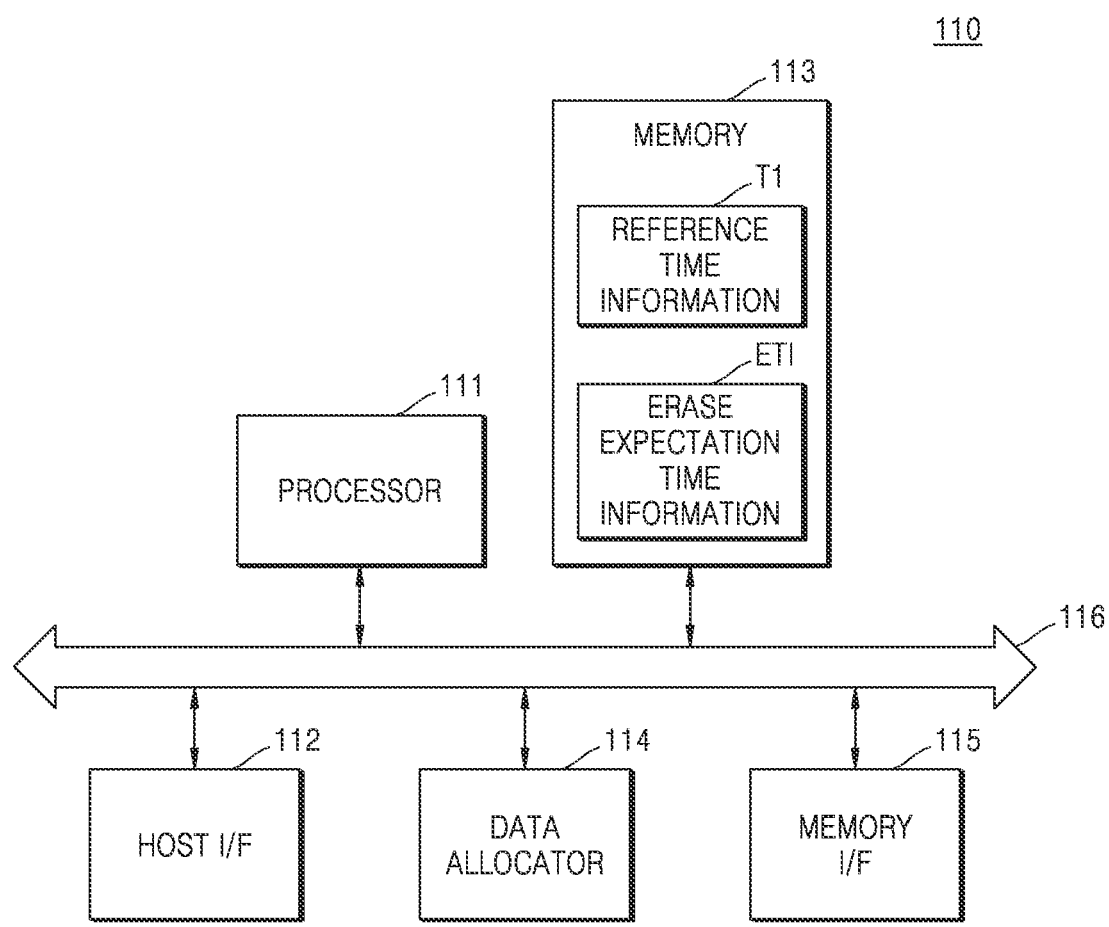
FIG. 2 is a block diagram further illustrating in one embodiment the storage controller of FIG. 1.

FIG. 2 is a block diagram further illustrating in one embodiment the storage controller 110 of FIG. 1.

Referring to FIGS. 1 and 2, the storage controller 110 may include a processor 111, a host interface 112, a memory 113, a data allocator 114, and a memory interface 115, wherein these elements may interconnected via one or more bus(es) 116. In some embodiments, the processor 111 may include a central processing unit (CPU) or a microprocessor and may control the overall operation of the storage controller 110. The processor 111 may include one or more processor cores configured to execute various instruction set(s) associated with program code capable of performing one or more operations. For example, the processor 111 may execute an instruction code of firmware stored in the memory 113.

The host interface 112 may serve as an interface between the host 200 and the storage controller 110, and may be configured in accordance with one or more of, for example, universal serial bus (USB), MMC, PCI-Express (PCI-E), AT attachment (ATA), serial AT attachment (SATA), parallel AT attachment (PATA), small computer system interface (SCSI), serial attached SCSI (SAS), enhanced small disk interface (ESDI), or integrated drive electronics (IDE). However configured, the host interface 112 may be used to receive a write requests WREQ, corresponding write data DATA, and associated storage time information STI from the host 200. Alternately or additionally, the host interface 112 may be used to receive a read request RREQ and provide corresponding read data DATA.

The memory 113 may be used as a working memory, a buffer memory, and/or a cache memory. The memory 113 may be implemented as dynamic RAM (DRAM), static RAM (SRAM), PRAM, and/or flash memory. The storage time information STI received from the host 200 may be stored in the memory 113. In some embodiments, reference time information T1 used to determine a particular memory region within the non-volatile memory 120 in which the write data DATA is to be stored may be stored in the memory 113. In some embodiments, erase expectation time information ETI indicating an erase expectation time for the write data DATA (e.g., a time at which the data DATA is expected to be erased after programming) may be stored in the memory 113.

The data allocator 114 may determine (or select) a particular memory region in which to store the write data DATA on the basis of the storage time information STI. That is, the data allocator 114 may compare a reference time with a storage time for the write data DATA corresponding to the storage time information STI on the basis of the reference time information T1 stored in the memory 113 and/or the storage time information STI. That is, based on this comparison result, the particular memory region may be determined from among a plurality of memory regions.

Further in this regard, one example of reference time information T1 will be described hereafter in some additional detail with reference to FIG. 5.

Further, in some embodiments, in accordance with (or based on) the storage time information STI, the data allocator 114 may set an erase expectation time at which the data DATA is to be erased following programming. The erase expectation time information ETI may be stored in the memory 113. The data allocator 114 may control the non-volatile memory 120 such that the data DATA is erased, on the basis of the erase expectation time information ETI, when the erase expectation time elapses following the programming of the data DATA.

According to various embodiments, the data allocator 114 may be implemented in hardware, software, and/or firmware. When the data allocator 114 is implemented as software or firmware, the data allocator 114 may be loaded into the memory 113 and may operate under the control of the processor 111.

The memory interface 115 may serve as an interface between the storage controller 110 and the non-volatile memory 120. For example, various data signals, commands, control signals, and/or address signals may be communicated (e.g., transferred and received) between the storage controller 110 and the non-volatile memory 120 through the memory interface 115.

According to various embodiments, the storage controller 110 may include a flash translation layer (FTL), a packet manager, an error correction code (ECC) engine, and/or an advanced encryption standard (AES) engine. The FTL may be used to perform various functions such as address mapping, wear-leveling, and garbage collection. The packet manager may be used to generate packets in accordance with one or more data communication protocol(s) as agreed upon with the host 200. In this regard, the packet manager may parse various data and/or information received from the host 200. The ECC engine may be used to perform an error detection and/or correction function on read data (e.g., using parity bits associated with the read data) retrieved from non-volatile memory 120 during a read operation. The AES engine may be used to perform encryption/decryption operations on data stored in the storage controller 110 (e.g., using a symmetric-key algorithm).

Figure 3:
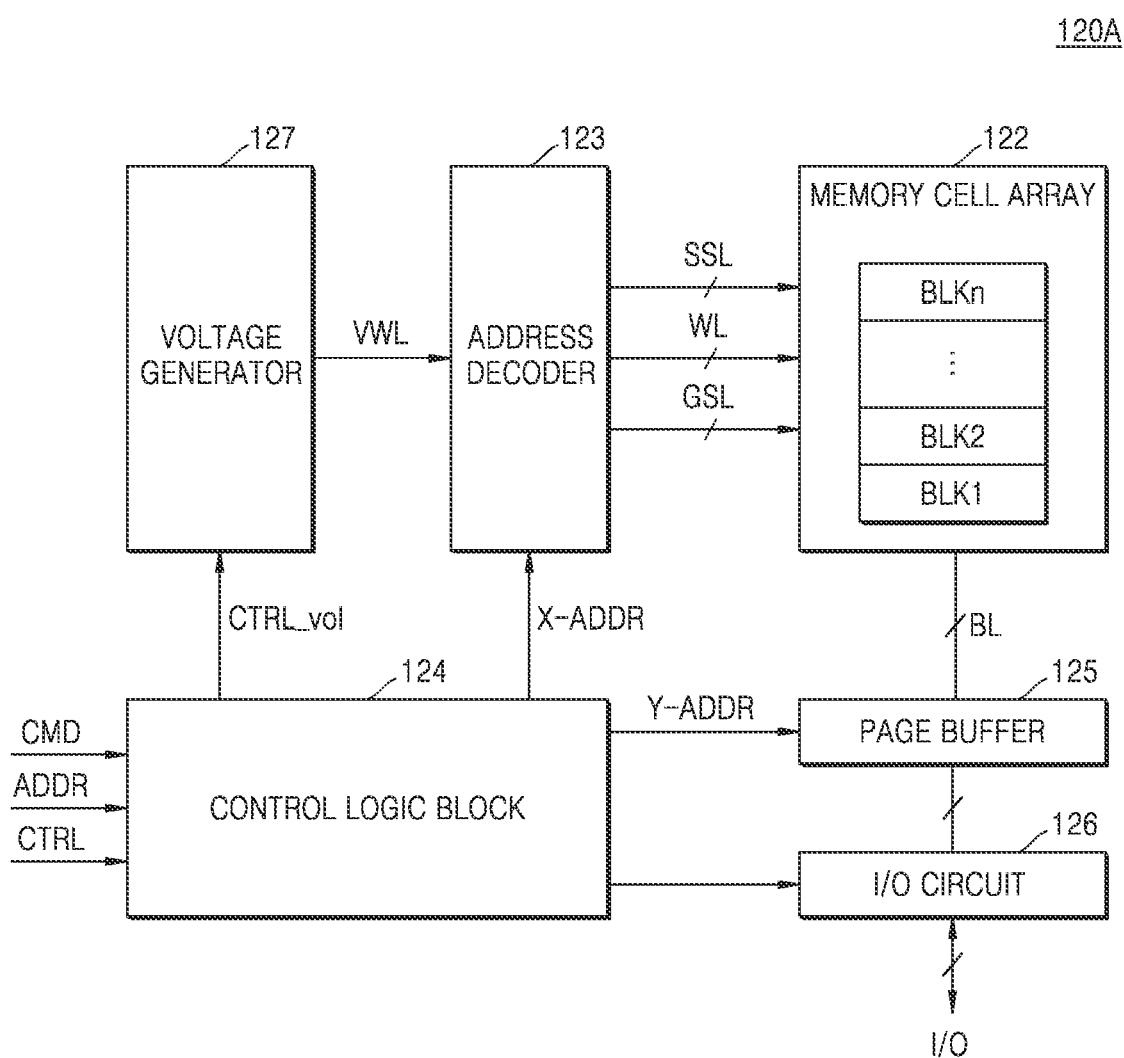
FIG. 3 is a block diagram further illustrating a memory device that may be incorporated in the non-volatile memory of FIG. 1.

FIG. 3 is a block diagram further illustrating in one example a memory device 120A that may be included in the non-volatile memory 120 of FIG. 1. That is, in some embodiments, the non-volatile memory 120 of FIG. 1 may include at least one of the memory device 120A.

Referring to FIGS. 1 and 3, the memory device 120A may include a memory cell array 122, an address decoder 123, a control logic block 124, a page buffer 125, an input/output (I/O) circuit 126, and a voltage generator 127. Although not shown, the memory device 120A may further include an I/O interface.

The memory cell array 122 may be connected to word lines WL, string selection lines SSL, ground selection lines GSL, and bit lines BL. The memory cell array 122 may be connected to the address decoder 123 through the word lines WL, the string selection lines SSL, and the ground selection lines GSL and may be connected to the page buffer 125 through the bit lines BL. The memory cell array 122 may include a number of memory blocks BLK1 to BLKn.

Each of the memory blocks BLK1 to BLKn may include memory cells and related selection transistors. The memory cells may be connected to the word lines WL, and the selection transistors may be connected to the string selection lines SSL or the ground selection lines GSL. Each of the memory blocks BLK1 to BLKn may correspond to an erase unit. Each of the memory blocks BLK1 to BLKn may include a number of pages, wherein each of the pages may correspond to a unit of programming or reading data in its constituent memory block.

In some embodiments, the memory blocks BLK1 to BLKn may be divided into the first memory region MR1, the second memory region MR2, and the third memory region MR3 of FIG. 1. For example, the first memory region MR1 may include memory blocks including SLC, the second memory region MR2 may include memory blocks including MLC and TLC, and the third memory region MR3 may include memory blocks including QLC. However, the inventive concept is not limited thereto, and alternately for example, the non-volatile memory 120 may include a number of memory devices, wherein each memory device includes SLC, MLC, TLC, and QLC.

The address decoder 123 may be used to select a memory block from among the memory blocks BLK1 to BLKn of the memory cell array 122, select a word line WL from among the word lines WL of the selected memory block, and select a string selection line SSL from among a number of string selection lines SSL.

The control logic block 124 may output various control signals associated with the respective performance of a program operation, a read operation, and an erase operation on the memory cell array 122 in response to a command CMD, an address ADDR, and/or a control signal CTRL. In this regard, the control logic block 124 may provide a row address X-ADDR to the address decoder 123, provide a column address Y-ADDR to the page buffer 125, and provide a voltage control signal CTRL_Vol to the voltage generator 127.

The page buffer 125 may alternately operate as a write driver or a sense amplifier in accordance with a currently performed operation. For example, during read operation, the page buffer 125 may be used to sense a bit line BL associated with a selected memory cell under the control of the control logic block 124. The resulting sensed data may then be stored in latches included in the page buffer 125. The page buffer 125 may then dump data stored in the latches to the I/O circuit 126 under the control of the control logic block 124.

The I/O circuit 126 may be used to temporarily store the command CMD, the address ADDR, the control signal CTRL, as well as data provided through an I/O line and communicated to an external circuit outside of the memory device 120A. The I/O circuit 126 may also be used to temporarily store read data retrieved from the memory device 120A, and then communicated to an external circuit outside through memory device 120A at a predetermined time.

The voltage generator 127 may be used to generate one or more voltages for respectively performing the program operation, the read operation, and the erase operation on the memory cell array 122 in response to the voltage control signal CTRL_Vol. That is, the voltage generator 127 may be used to generate a word line voltage VWL, a program voltage, a read voltage, a pass voltage, an erase verification voltage, a program verification voltage, etc. The voltage generator 127 may also be used to generate a string selection line voltage and a ground selection line voltage in response to the voltage control signal CTRL_Vol. The voltage generator 127 may also be used to generate an erase voltage provided to the memory cell array 122 during an erase operation.

Figure 4:
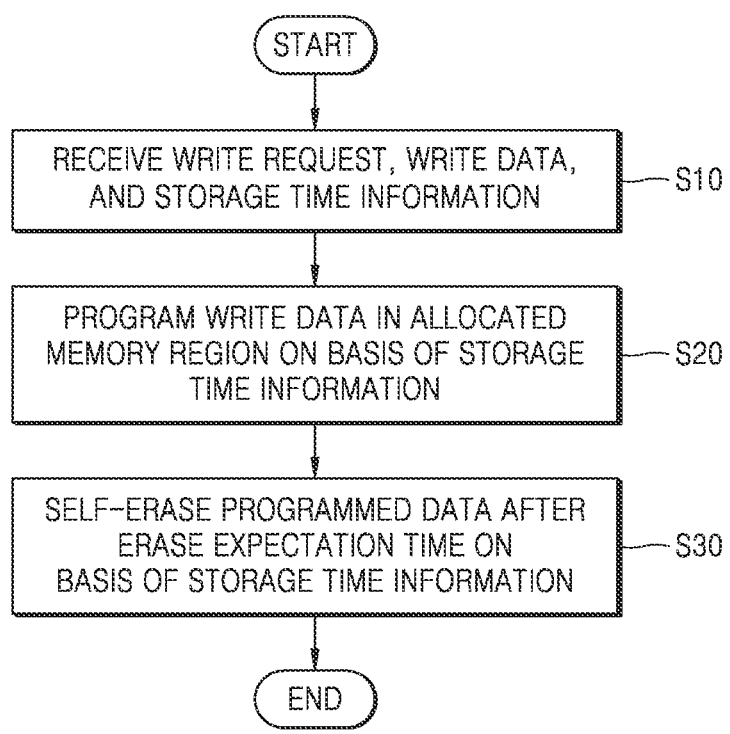
FIG. 4 is a flowchart illustrating an operating method for a storage device according to an embodiment.
Figure 5:
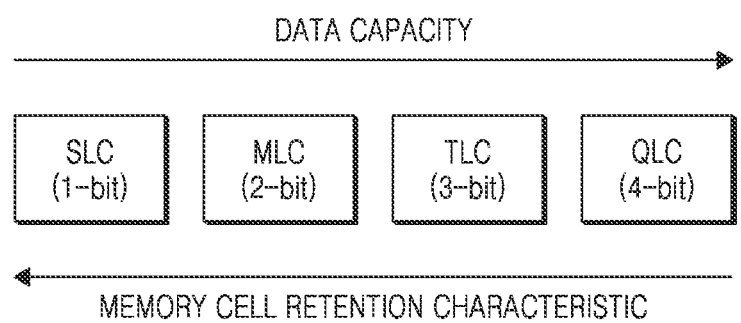
FIG. 5 is a conceptual diagram further illustrating in one embodiment step S20 of the operating method of FIG. 4.

FIG. 4 is a flowchart illustrating an operating method for the storage device 100 of FIG. 1, and FIG. 5 is a conceptual diagram further illustrating in one embodiment step S20 of the operating method of FIG. 4.

Referring to FIGS. 1 and 4, the storage device 100 may receive a write request WREQ, corresponding write data, and the storage time information STI associated with the write data from the host 200 (S10). The storage time information STI may indicate a minimum time for maintaining a programmed state while satisfying a reliability condition for the write data after the write data has been programmed. That is, the write data may need to maintain reliability and a programmed state for a certain storage time after being programmed in the non-volatile memory 120.

The storage device 100 may then program (or write) the write data in an allocated (or selected) memory region in accordance with (or on the basis of) the storage time information STI (S20). That is, consistent with the foregoing, the storage device 100 may program the data in an allocated memory region selected from among a number of memory regions (e.g., the first to third memory regions MR1 to MR3).

Referring to FIGS. 1, 4, and 5, as the data capacity provided by a memory cell increases, a memory cell retention time ensuring reliability of data stored in the memory cell decreases. Thus, as conceptually illustrated in FIG. 5, as the data capacity increases from SLC storing 1-bit data, to MLC storing 2-bit data, to TLC storing 3-bit data, and to QLC storing 4-bit data, corresponding memory cell retention characteristics become increasingly degraded. That is, data stored in the QLC will degrade faster than data stored in the TLC, data stored in the TLC will degrade faster than data stored in the MLC, and data stored in the MLC will degrade faster than data stored in the SLC. For example, a first data retention time for the SLC may be about five years, a second data retention time for the MLC may be about one year, a third data retention time for the TLC may be about three months, and a fourth data retention time for the QLC may be about one month.

Extending the example described above in relation to FIG. 1, the non-volatile memory 120 may include the first memory region MR1 including SLC, the second memory region MR2 including MLC and TLC, and the third memory region MR3 including QLC. Accordingly, the reference time information T1 including data retention reference time information corresponding to each memory region may be stored in a memory (e.g., memory 113) associated with the storage controller 110. For example, the reference time information Ti may include; a first reference time TR1 for the first memory region MR1, a second reference time TR2 for the second memory region MR2, wherein the first reference time TR1 is longer than the second reference time TR2.

The storage device 100 may compare a storage time associated with write data to be stored with the first reference time TR1 and the second reference time TR2 in order to allocate an appropriate memory region in which the write data is to be programmed. For example, when the storage time for the write data is less than the second reference time TR2, the third memory region MR3 may be allocated. Alternately, when the storage time for the write data is greater than or equal to the second reference time TR2 and less than the first reference time TR1, the second memory region MR2 may be allocated. And alternately, when the storage time for the write data is greater than or equal to the first reference time TR1, the first memory region MR1 may be allocated. Because a state in which the data DATA is programmed in the non-volatile memory 120 must also be considered, as storage time associated with the write data increases, the write data may be programmed in the first memory region MR1, rather than the third memory region MR3 under certain conditions.

Referring again to FIGS. 1 and 4, the storage device 100 may self-erase the programmed data following an erase expectation time for the data on the basis of the storage time information STI (S30). That is, the storage device 100 may self-erase stored data—even in the absence of a requested erase operation by the host 200. In this case, the erase expectation time for the data may be greater than or equal to storage time for the data. Thus, the storage device 100 may self-erase the data previously programmed in the non-volatile memory 120 at a point in time when the data is expected to degrade.

In this manner, the storage device 100 of FIG. 1 may, during a program operation, allocate a memory region having a suitable data retention characteristic in view of a characteristic of the write data to be stored, program the write data, and thereafter perform a self-erase operation on the stored data at a time at which reliability of the data become cannot be assured. As a result, the storage device 100 may decrease a cycle count for program/erase operations on the basis of a recovery code such that enhanced data reliability is achieved along with improved overall performance for the storage system 10.

Figure 6:
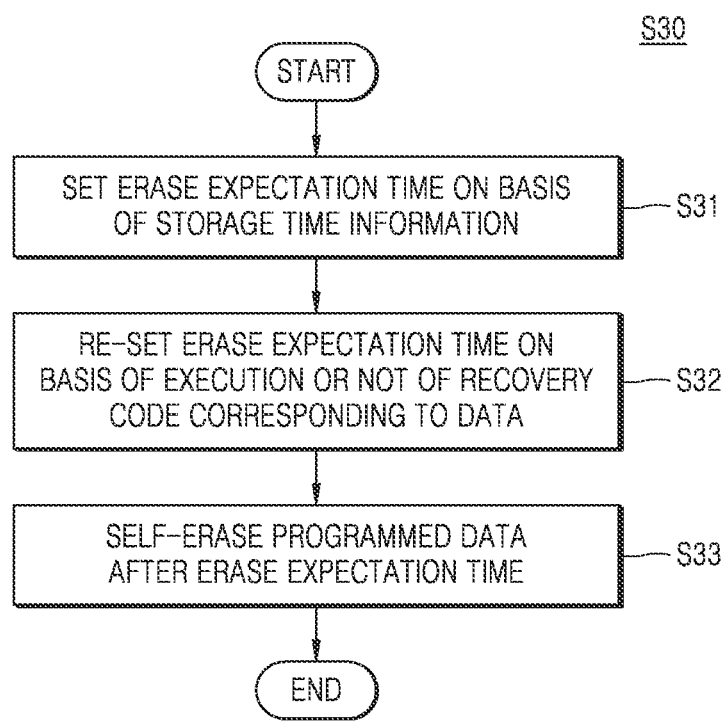
FIG. 6 is a flowchart further illustrating in one embodiment step S30 of the operating method of FIG. 4.

FIG. 6 is a flowchart further illustrating in one embodiment step S30 of the operating method of FIG. 4.

Referring to FIGS. 1 and 6, the storage device 100 may set an erase expectation time for data on the basis of the storage time information STI associated with the data (S31). Thus, the erase expectation time may be a time at which an expected reliability of the data cannot be assured following programming of the data. In some embodiments, the erase expectation time for data may be greater than or equal to a storage time for the data.

The storage device 100 may re-set the erase expectation time on the basis of the execution, or not, of a recovery code corresponding to the stored data (S32). For example, the storage device 100 may change a read level in order to remove a read error from data stored in the non-volatile memory 120, or perform a read reclaim operation by reprogramming the data to a free memory block. For example, the storage device 100 may execute a recovery code using firmware in order to enhance reliability of a read operation retrieving the data from the non-volatile memory 120. In a case where the recovery code corresponding to the programmed data is executed, the storage device 100 may change a corresponding erase expectation time.

The storage device 100 may then self-erase the programmed data after the erase expectation time (S33).

Figure 7:
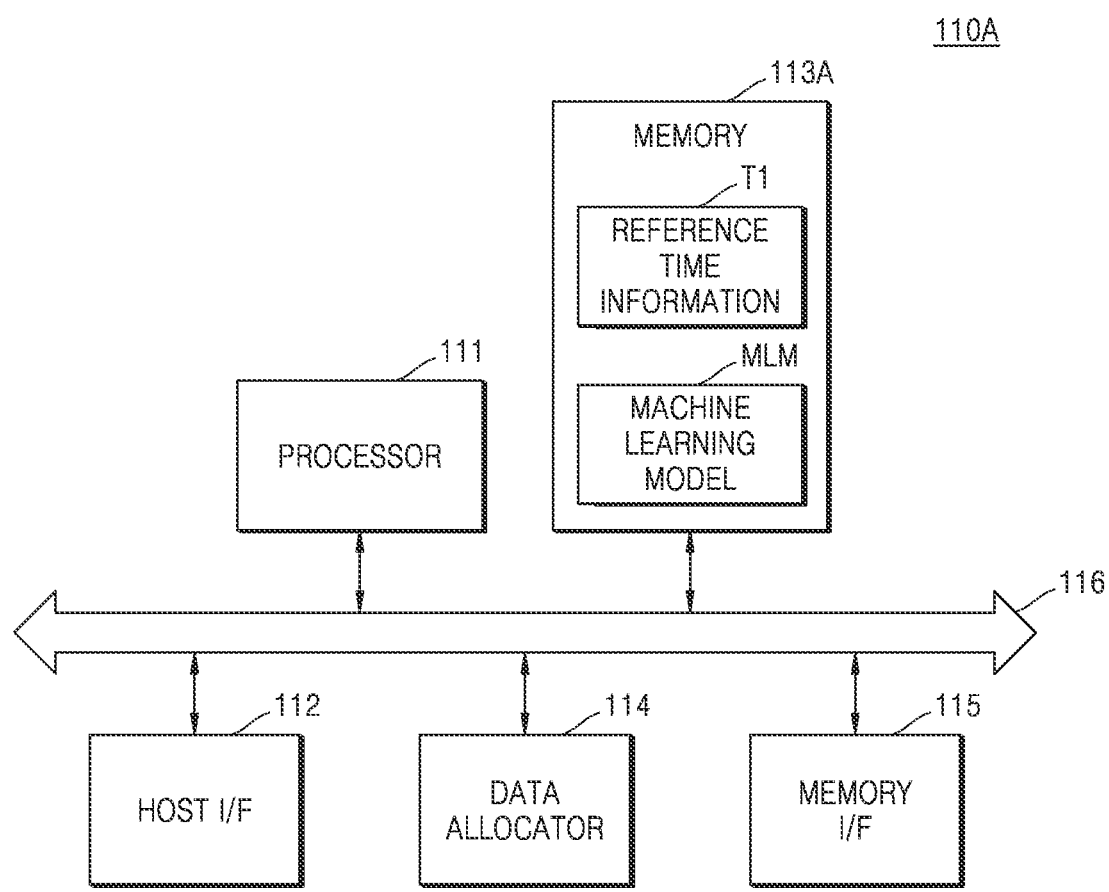
FIG. 7 is a block diagram further illustrating in another embodiment the storage controller of FIG. 1.

FIG. 7 is a block diagram further illustrating in another embodiment the storage controller (100A) of FIG. 1, and may be compared with the embodiment of FIG. 2.

Referring to FIGS. 1 and 7, the storage controller 110A may include a processor 111, a host interface 112, a memory 113A, a data allocator 114, and a memory interface 115, and those elements may communicate with one another through a bus 116.

The processor 111 may execute a machine learning tool stored in the memory 113A and may perform machine learning. In some embodiments, the storage controller 110A may include a separate processor used to perform the machine learning.

The memory 113A may store the machine learning tool which extracts information related to storage time(s) for data based on characteristic(s) of the data. Thereafter, the processor may store a resulting machine learning model MLM to be processed by the machine learning tool, as well as information related to storage time(s) generated by the machine learning tool.

The storage controller 110 may collect relevant machine learning results for the data and storage time information STI associated with the data, as received from the host 200 over a defined period of time, and may perform machine learning on the basis of the collected information, thereby extracting the machine learning model MLM. Even when storage time information STI is not received from the host 200, the storage controller 110 may obtain the storage time information STI corresponding to the data using the machine learning model MLM. Therefore, even when the storage time information STI is not received from the host 200, the storage controller 110 may select and program a particular memory region of the storage device 100 in accordance with characteristic(s) of the data.

However, the machine learning model MLM may not be extracted through a machine learning operation performed internal to the storage device 100. That is, the storage device 100 may receive the machine learning model MLM from an external source and/or perform an inference operation using an externally provided machine learning model MLM. Alternately or additionally, the storage device 100 may receive the extracted machine learning model MLM from an external source.

Figure 8:
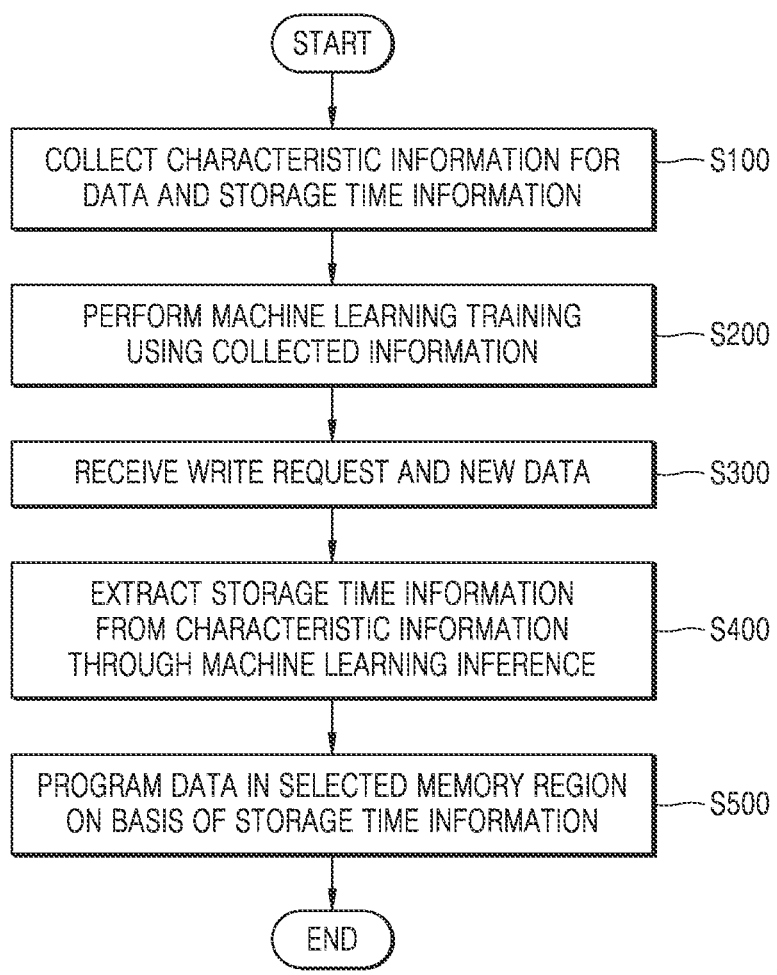
FIG. 8 is a flowchart illustrating an operating method for a storage device according to an embodiment.

FIG. 8 is a flowchart illustrating an operating method for the storage device 100 of FIG. 1 according to an embodiment.

Referring to FIGS. 1 and 8, the storage device 100 may collect characteristic information for the data, as well as storage time information STI for data (S100). In some embodiments, the storage device 100 may collect the characteristic information and the storage time information STI for the data, as received from the host 200. For example, operation S100 may be performed by repeatedly performing operation S10 of FIG. 4 over a period of time. Alternately, the storage device 100 may collect the characteristic information and storage time information STI for the data stored in the storage device 100.

The storage device 100 may then perform machine learning training using the collected information (e.g., characteristic information and storage time information STI for the data) (S200). In some embodiments, the collected information may be preprocessed for suitable use by the machine learning tool.

An error of a machine learning model (e.g., MLM of FIG. 7) extracted through the machine learning training may be evaluated. When the accuracy of the machine learning model MLM is less than a criterion on the basis of an evaluation result, retraining may be performed, and thus, the degree of learning for the machine learning model MLM may increase and the accuracy thereof may be enhanced.

The storage device 100 may receive a new write request WREQ and corresponding new write data from the host 200 (S300), wherein storage time information associated with the new write data is not received from the host 200.

Under such conditions, the storage device 100 may obtain characteristic information for the new write data and extract storage time information STI for the new write data from the characteristic information using a machine learning inference(S400). For example, in a case where photographic-related data associated with a photograph important to a user is stored in the storage device 100, such photographic-related data may have been stored in the storage device 100 for a relatively long period of time. Alternately, moving image data associated with a video clip may only be stored in the storage device 100 for a relatively short period of time. Therefore, even when the storage time information STI for data is not received from the host 200, a storage time for the data may be extracted using characteristic(s) of the data through a machine learning inference.

The storage device 100 may program the data in a selected memory region on the basis of the extracted storage time information STI (S500). Therefore, even when storage time information STI is not received from the host 200, the storage controller 110 may nonetheless select and program data to a particular memory region of the storage device 100 in accordance with characteristic(s) of the data. Following step S500, operation S30 of FIG. 4 may be performed.

Figure 9:
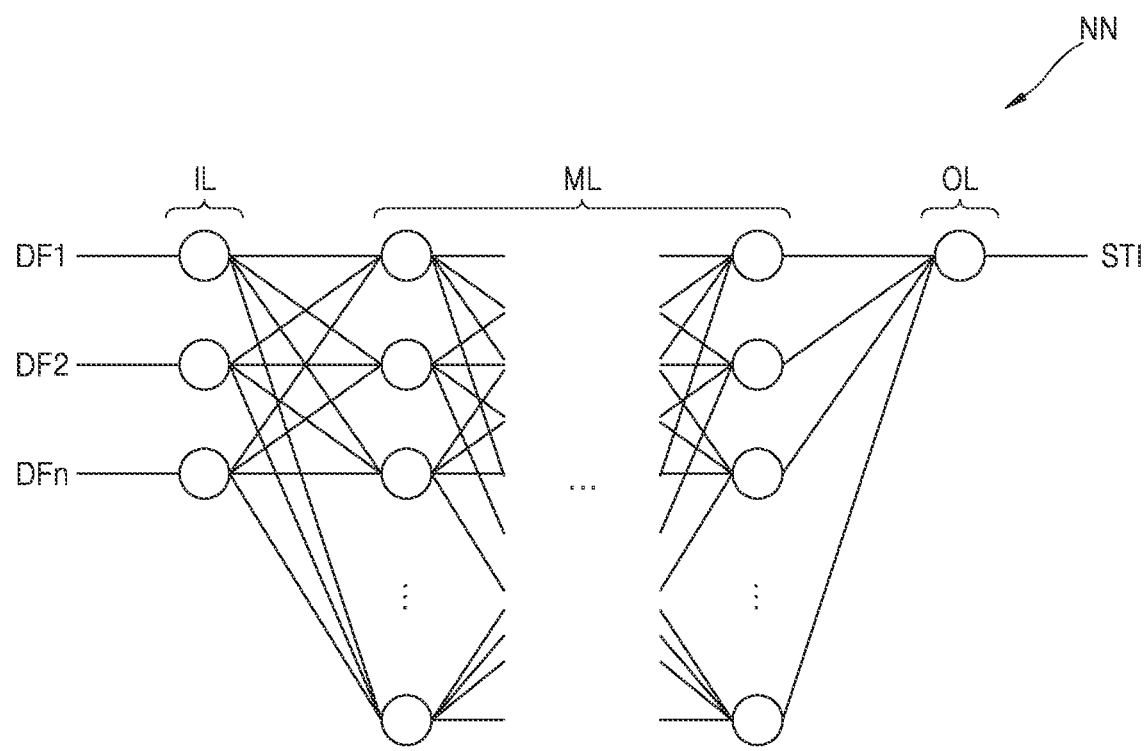
FIG. 9 is a conceptual diagram further illustrating in one embodiment step S400 of the operating method of FIG. 8.

FIG. 9 is a conceptual diagram further illustrating in one embodiment step S400 of the operating method of FIG. 8. Here, the conceptual diagram may be understood as visually describing a machine learning inference operation using a machine learning model.

Referring to FIG. 9, in some embodiments, a machine learning model (e.g., MLM of FIG. 7) may be implemented as a neural network model NN and may predict a storage time of data. The neural network model NN may be implemented as software executed by a processor included in a storage device. The neural network model NN of FIG. 9 may be merely an embodiment, and the machine learning model MLM is not limited thereto and may be implemented as various models. The machine learning model MLM may include, for example, a linear regression model, a polynomial regression model, a random forecast model, a multi-layer perceptron (fully connected neural network) model, a neural network model, a deep learning model, and a reinforcement learning model. The neural network model NN may include, for example, a convolutional neural network model and a recurrent neural network model. In FIG. 9, as an example of a machine learning model, the neural network model NN which is a deep neural network model will be described, but the inventive concept is not limited thereto.

The neural network model NN may include a multilayer including an input layer IL, one or more middle layers ML, and an output layer OL. The input layer IL may receive one or more input values DF1 to DFn, where 'n' is a natural number, (e.g., characteristic information for data). The output layer OL may generate a prediction output value (e.g., storage time information STI for the data).

Each of the input layer IL, the one or more middle layers ML, and the output layer OL of the neural network model NN may include a plurality of nodes referred to as a neuron. Each node or neuron may represent a calculation unit having one or more inputs and outputs. Each of inputs from a plurality of nodes of a layer may be supplied to each node of an adjacent layer. Similarly, an output may be supplied to a plurality of nodes of an adjacent layer. The number of nodes of each of the input layer IL, the one or more middle layers ML, and the output layer OL may be the same or differ on the basis of an application of the neural network model NN. In an embodiment, only two middle layers ML having a same number of nodes are illustrated, but there may be an arbitrary number of middle layers or a different number of middle layers without departing from the inventive concept.

Figure 10:
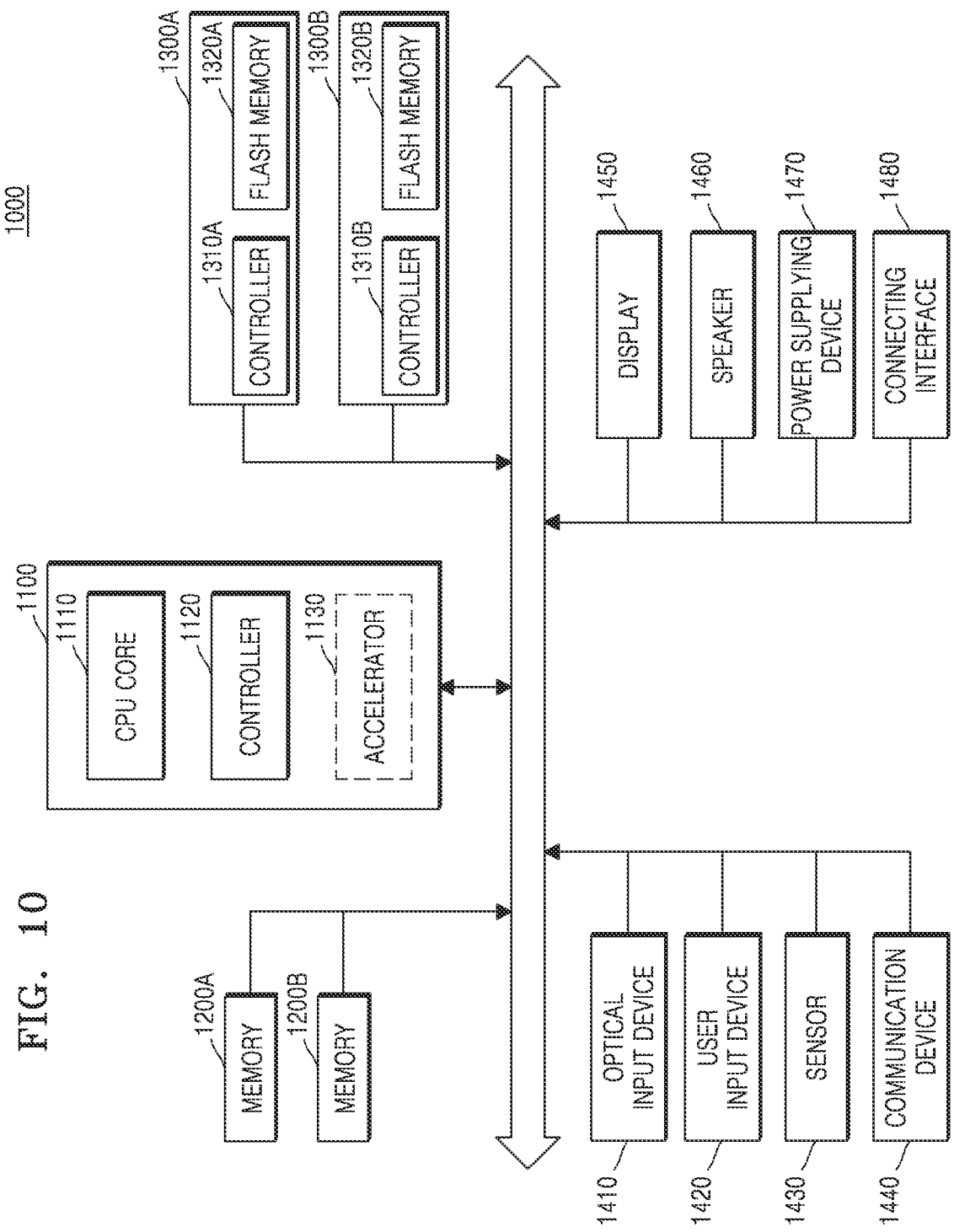
FIG. 10 is a block diagram illustrating a system including a storage device according to an embodiment.

FIG. 10 is a block diagram illustrating a system 1000 that may incorporate a storage device according to an embodiment.

Referring to FIG. 10, the system 1000 may include a mobile system, such as a mobile phone, a smartphone, a tablet PC, a wearable device, a healthcare device, or an IoT device. However, the system 1000 of FIG. 10 is not limited to a mobile system and may include automotive equipment, a PC, a laptop computer, a server, a media player, or a navigation device.

Referring to FIG. 10, the system 1000 may include a main processor 1100, memories 1200a and 1200b, and storage devices 1300a and 1300b, and additionally, may include one or more of an image capturing device 1410, a user input device 1420, a sensor 1430, a communication device 1440, a display 1450, a speaker 1460, a power supplying device 1470, and a connecting interface 1480.

The main processor 1100 may control an overall operation of the system 1000, and in more detail, may control operations of the other elements associated with the system 1000. The main processor 1100 may be implemented as a general-use processor, a dedicated processor, or an application processor.

The main processor 1100 may include one or more CPU cores 1110 and may further include a controller 1120 for controlling the memories 1200a and 1200b and/or the storage devices 1300a and 1300b. In an embodiment, the main processor 1100 may further include an accelerator block 1130 which is a dedicated circuit for a high-speed data operation such as an artificial intelligence (AI) data operation. The accelerator block 1130 may include a graphics processing unit (GPU), a neural processing unit (NPU), and/or a data processing unit (DPU) and may be implemented as a separate chip which is physically independent from the other elements of the main processor 1100.

The memories 1200a and 1200b may be used as a main memory device of the system 1000 and may include a volatile memory such as SRAM and/or DRAM, or may include a non-volatile memory such as PRAM and/or RRAM. The memories 1200a and 1200b and the main processor 1100 may be implemented in the same package.

The storage devices 1300a and 1300b may function as a non-volatile storage device which stores data regardless of the supply or not of power and may have a storage capacity which is relatively greater than that of each of the memories 1200a and 1200b. The storage devices 1300a and 1300b may include storage controllers 1310a and 1310b and non-volatile memories (NVM) 1320a and 1320b which store data on the basis of control by the storage controllers 1310a and 1310b. The non-volatile memories 1320a and 1320b may include NAND flash memory, or may include another kind of non-volatile memory such as PRAM and/or RRAM.

The storage devices 1300a and 1300b may be included in the system 1000 with being physically detached from the main processor 1100, and the storage devices 1300a and 1300b and the main processor 1100 may be implemented in the same package. Also, the storage devices 1300a and 1300b may have a type such as an SSD or a memory card, and thus, may be detachably coupled to the other elements of the system 1000 through an interface such as the connecting interface 1480 to be described below. The storage devices 1300a and 1300b may each be a device to which standard such as UFS is applied. The storage devices 1300a and 1300b may be implemented as the storage device 100 described above with reference to FIGS. 1 to 10. Therefore, the storage devices 1300a and 1300b may select and program a memory region on the basis of a characteristic of received data and may perform a self-erase operation on data where data reliability is not ensured. Accordingly, data reliability may be enhanced and performance may be improved.

The image capturing device 1410 may capture a still image or a moving image and may include a camera, a camcorder, and/or a webcam.

The user input device 1420 may receive pieces of data having various formats input from a user of the system 1000 and may include a touch pad, a keypad, a keyboard, a mouse, and/or a microphone.

The sensor 430 may sense various types of physical amounts capable of being obtained from the outside of the system 1000 and may convert a sensed physical amount into an electrical signal. The sensor 1430 may include a temperature sensor, a pressure sensor, an illumination sensor, a position sensor, an acceleration sensor, a biosensor, and/or a gyroscope.

The communication device 1440 may transmit and receive a signal between other devices outside the system 1000 and the system 1000 on the basis of various communication protocols. The communication device 1440 may include an antenna, a transceiver, and/or a modem.

The display 1450 and the speaker 1460 may function as an output device which outputs visual information and acoustic information to the user of the system 1000.

The power supplying device 1470 may appropriately convert power supplied from a battery embedded into the system 1000 and/or an external power source and may supply converted power to each element of the system 1000.

The connecting interface 1480 may provide a connection between the system 1000 and an external device which is connected to the system 1000 and transmits and receives data to and from the system 1000. The connecting interface 1480 may be implemented as various interface types such as advanced technology attachment (ATA), serial ATA (SATA), external SATA (e-SATA), small computer system interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), and compact flash (CF) card interface.

Figure 11:
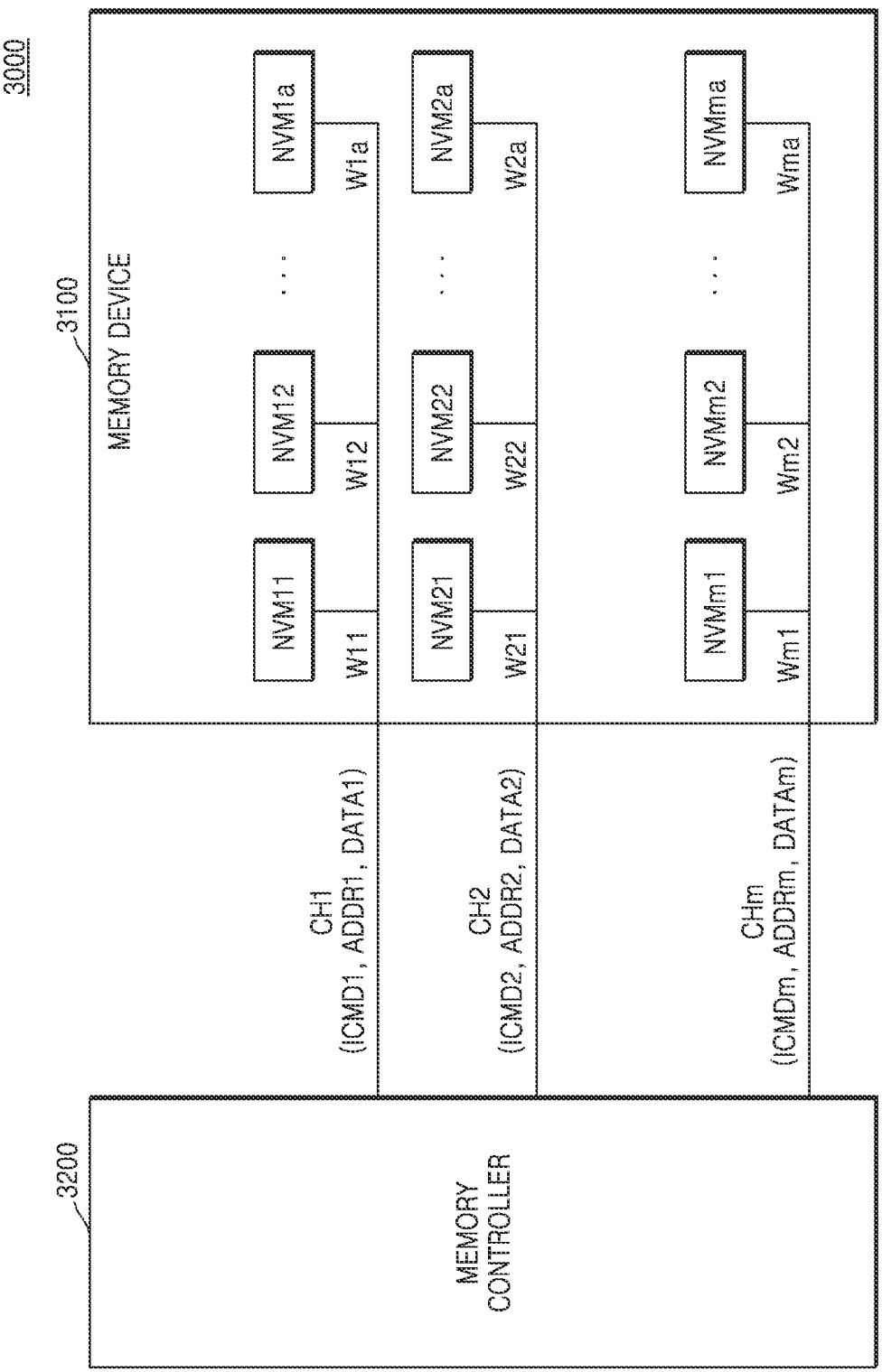
FIG. 11 is a block diagram illustrating a memory system according to an embodiment.

FIG. 11 is a block diagram illustrating a memory system 3000 according to an embodiment.

Referring to FIG. 11, the memory system 3000 may include a memory device 3100 and a memory controller 3200. The memory system 3000 may support a plurality of channels CH1 to CHm, and the memory device 3100 may be connected to the memory controller 3200 through the plurality of channels CH1 to CHm. For example, the memory system 3000 may be implemented as a storage device such as an SSD. The memory device 3100 may include the non-volatile memory 120 of FIG. 1, and the memory controller 3200 may include the storage controller 110 of FIG. 1.

The memory device 3100 may include a plurality of non-volatile memory devices NVM11 to NVMma. Each of the plurality of non-volatile memory devices NVM11 to NVMma may be connected to one of the plurality of channels (for example, first to mth channels) CH1 to CHm through a corresponding way. For example, the plurality of non-volatile memory devices NVM11 to NVM1a may be connected to the first channel CH1 through ways W11 to W1a, and the plurality of non-volatile memory devices NVM21 to NVM2a may be connected to the second channel CH2 through ways W21 to W2a. In an embodiment, each of the plurality of non-volatile memory devices NVM11 to NVMma may be implemented as an arbitrary memory unit, on the basis of an individual instruction from the memory controller 3200. For example, each of the plurality of non-volatile memory devices NVM11 to NVMma may be implemented as a memory chip or a memory die, but the inventive concept is not limited thereto. For example, the each of the plurality of non-volatile memory devices NVM11 to NVMma may include first to a-th memory dies DIE1 to DIEa of FIG. 1.

The memory controller 3200 may transfer and receive signals to and from the memory device 3100 through the plurality of channels CH1 to CHm. For example, the memory controller 3200 may transfer commands ICMD1 to ICMDm, addresses ADDR1 to ADDRm, and pieces of data DATA1 to DATAm to the memory device 3100 through the channels CH1 to CHm, or may receive the pieces of data DATA1 to DATAm from the memory device 3100.

The memory controller 3200 may select one non-volatile memory device from among non-volatile memory devices connected to a corresponding channel through each channel and may transfer and receive signals to and from the selected non-volatile memory device. For example, the memory controller 3200 may select the non-volatile memory device NVM11 from among the non-volatile memory devices NVM11 to NVM1a connected to the first channel CH1. The memory controller 3200 may transfer the command ICMD1, the address ADDR1, and the data DATA1 to the selected non-volatile memory device NVM11 through the first channel CH1, or may receive the data DATA1 from the selected non-volatile memory device NVM11.

The memory controller 3200 may transfer and receive signals to and from the memory device 3100 through different channels. For example, the memory controller 3200 may transfer the command ICMD2 to the memory device 3100 through the second channel CH2 in the middle of transferring the command ICMD1 to the memory device 3100 through the first channel CH1. For example, the memory controller 3200 may receive the data DATA2 from the memory device 3100 through the second channel CH2 in the middle of receiving the data DATA1 from the memory device 3100 through the first channel CH1.

The memory controller 3200 may control an overall operation of the memory device 3100. The memory controller 3200 may transfer a signal to the channels CH1 to CHm to control the non-volatile memory devices NVM11 to NVMma connected to the channels CH1 to CHm. For example, the memory controller 3200 may transfer the command ICMD1 and the address ADDR1 to the first channel CH1 to control one non-volatile memory devices selected from among the non-volatile memory devices NVM11 to NVM1a.

Each of the non-volatile memory devices NVM11 to NVMma may operate based on control by the memory controller 3200. For example, the non-volatile memory device NVM11 may program the data DATA1 on the basis of the command ICMD1, the address ADDR1, and the data DATA1 each provided through the first channel CH1. For example, the non-volatile memory device NVM21 may read the data DATA2 on the basis of the command ICMD2 and the address ADDR2 each provided through the second channel CH2 and may transfer the read data DATA2 to the memory controller 3200.

In FIG. 11, it is assumed that the memory device 3100 communicates with the memory controller 3200 through m number of channels and includes a number of non-volatile memory devices on the basis of each channel, but the number of channels and the number of non-volatile memory devices connected to one channel may be variously changed.

While the inventive concept has been particularly shown and described with reference to embodiments thereof, it will be understood that various changes in form and details may be made therein without departing from the spirit and scope of the following claims.

What is claimed is:

1. A storage device comprising:
a non-volatile memory including a first memory region including first memory cells having a first data storage capacity, a second memory region including second memory cells having a second data storage capacity greater than the first data storage capacity, and a third memory region including third memory cells having a third data storage capacity greater than the second data storage capacity; and
a storage controller configured to receive a request, data, and storage time information associated with the data from a host, and program the data in a selected one of the first memory region, the second memory region and the third memory region in response to the request and on the basis of the storage time information, wherein the storage time information indicates a storage time for the data,
wherein the storage controller is further configured to:
program the data in the first memory region based on the storage time for the data being greater than or equal to a first reference time,
program the data in the second memory region based on the storage time for the data being greater than or equal to a second reference time and less than the first reference time, or
program the data in the third memory region based on the storage time for the data being less than the second reference time, and
wherein the storage controller is further configured to:
determine an erase expectation time for the data based on the storage time information, and
self-erase the data in response to elapse of the erase expectation time since the data is programmed.

2. The storage device of claim 1, wherein the first memory cells are single level memory cells configured to store 1-bit data, the second memory cells are multi-level memory cells configured to store at least one of 2-bit data and 3-bit data, and the third memory cells are quad-level memory cells configured to store 4-bit data.

3. The storage device of claim 1, wherein the storage controller is further configured to store the erase expectation time in a memory of the storage controller, the memory distinct from the non-volatile memory.

4. The storage device of claim 1, wherein the erase expectation time is greater than or equal to the storage time of the data, and
the storage time of the data is a minimum time period during which the data satisfies a reliability condition for a programmed state.

5. The storage device of claim 1, wherein the storage controller is further configured to re-set the erase expectation time based on whether a recovery code associated with the data is executed.

6. The storage device of claim 1, wherein each of the first memory region, the second memory region, and the third memory region includes a plurality of memory blocks, and each of the plurality of memory blocks constitutes an erase unit for a self-erase operation.

7. The storage device of claim 1,
further comprising:
a processor; and
a memory configured to store a machine learning tool executed by the processor, wherein the machine learning tool extracts information related to the storage time for data based on a characteristic of the data, and the memory is further configured to store at least one of the storage time information, reference time information including the first reference time, and the second reference time, and erase expectation time information.

8. A storage device comprising:

a non-volatile memory including a first memory region including first memory cells having a first data storage capacity, a second memory region including second memory cells having a second data storage capacity greater than the first data storage capacity, and a third memory region including third memory cells having a third data storage capacity greater than the second data storage capacity; and a storage controller including a processor and a memory configured to store a machine learning model, wherein the storage controller is configured to program data in the non-volatile memory in response to a write request received from a host, extract storage time information for the data from characteristic information of the data through machine learning inference using the machine learning model, and program the data in a selected one of the first memory region, the second memory region, or the third memory region on the basis of the storage time information, and wherein the storage controller is further configured to:
determine an erase expectation time for the data based on the storage time information, and
self-erase the data in response to elapse of the erase expectation time since the data is programmed.

9. The storage device of claim 8, wherein the storage controller is further configured to collect information associated with data previously received from the host and storage time information for the data previously received from the host, extract the machine learning model by performing machine learning training using the collected information and the storage time information, and store the extracted machine learning model in the memory.

10. The storage device of claim 8, wherein the erase expectation time is greater than or equal to a storage time of the data, the storage time indicated by the storage time information, and wherein the storage time of the data is a minimum time period during which the data satisfies a reliability condition for a programmed state.

11. The storage device of claim 8, wherein the memory is further configured to store reference time information and wherein the storage controller is further configured to program the data in the selected one of the first memory region, the second memory region, or the third memory region on the basis of the reference time information and the storage time information.

12. The storage device of claim 11, wherein the reference time information includes a first reference time and a second reference time less than the first reference time, and the storage controller is further configured to program the data in the first memory region based on a storage time of the data being greater than or equal to the first reference time, program the data in the second memory region based on the storage time of the data being greater than or equal to the second reference time and less than the first reference time, or program the data in the third memory region based on the storage time of the data being less than the second reference time.

13. The storage device of claim 8, wherein the first memory cells are single level memory cells configured to store 1-bit data, the second memory cells are multi-level memory cells configured to store 2-bit data or triple-level memory cells configured to store 3-bit data, and the third memory cells are quad-level memory cells configured to store 4-bit data.

14. The storage device of claim 8, wherein the memory is further configured to store the storage time information.

15. An operating method for a storage device, the operating method comprising:

receiving, by a storage controller of the storage device, a write request, data, and storage time information associated with the data;

programming, by the storage controller, the data in an allocated memory region of a non-volatile memory included in the storage device on the basis of the storage time information, wherein the non-volatile memory includes a first memory region including first memory cells having a first data storage capacity, a second memory region including second memory cells having a second data storage capacity greater than the first data storage capacity, and a third memory region including third memory cells having a third data storage capacity greater than the second data storage capacity;

determining, by the storage controller, an erase expectation time for the data based on the storage time information; and self-erasing the data, by the storage controller, in response to elapse of the when an erase expectation time since the data is programmed.

16. The operating method of claim 15, wherein the first memory cells are single level memory cells configured to store 1-bit data, the second memory cells are multi-level memory cells configured to store at least one of 2-bit data and 3-bit data, and the third memory cells are quad-level memory cells configured to store 4-bit data.

17. The operating method of claim 15, comprising re-setting the erase expectation time based on whether a recovery code corresponding to the data is executed.

18. The operating method of claim 15, wherein programming the data in the allocated memory region of the non-volatile memory includes selecting one of the first memory region, the second memory region, or the third memory region, as the allocated memory region, based on a comparison between a storage time for the data and a reference time, wherein the storage time for the data is indicated by the storage time information.

19. The operating method of claim 15, further comprising:
collecting characteristic information of the data; and
performing machine learning training using the characteristic information and the storage time information.

* * * * *